United States Patent [19]

Yoshikawa

[11] Patent Number: 4,559,603
[45] Date of Patent: Dec. 17, 1985

[54] APPARATUS FOR INSPECTING A CIRCUIT PATTERN DRAWN ON A PHOTOMASK USED IN MANUFACTURING LARGE SCALE INTEGRATED CIRCUITS

[75] Inventor: Ryoichi Yoshikawa, Yokohama, Japan

[73] Assignee: Tokyo Shibaura Denki Kabushiki Kaisha, Kawasaki, Japan

[21] Appl. No.: 535,334

[22] Filed: Sep. 23, 1983

[30] Foreign Application Priority Data

Oct. 5, 1982 [JP] Japan .................................. 57-173980

[51] Int. Cl.⁴ ............................................ G01N 21/32
[52] U.S. Cl. ................................. 364/491; 356/394; 356/237; 250/491.1; 250/492.2
[58] Field of Search ............... 364/490, 491, 559, 488, 364/489, 520; 356/394, 398, 448, 237; 358/101, 106; 250/491.1, 492.2

[56] References Cited

U.S. PATENT DOCUMENTS

| | | | |
|---|---|---|---|
| 4,218,142 | 8/1980 | Kryger et al. | 356/394 |
| 4,390,955 | 6/1983 | Arimura | 358/101 X |
| 4,392,120 | 7/1983 | Mita et al. | 356/237 X |
| 4,465,350 | 8/1984 | Westerberg | 364/491 X |
| 4,475,037 | 10/1984 | Vettiger et al. | 350/491.1 X |
| 4,508,453 | 4/1985 | Hara et al. | 356/394 |

FOREIGN PATENT DOCUMENTS 202080  8/1983  German Democratic Rep. .

OTHER PUBLICATIONS

An Automated Mask Inspection System–AMIS–Bruning et al., IEEE Trans. on Electron Devices, vol. ED-22, No. 77, 7/75, pp. 487–495.
Solid State Technology, Kenneth Levy, "Automated Equipment for 100% Inspection of Photomasks", vol. 21, No. 5, pp. 60–66, 71 (May 1978).
Solid State Technology, vol. 21, No. 5, (May 1978), D. B. Novotny et al., "Automated Photomask Inspection", pp. 51–59, 76.
Solid State Technology, vol. 21, No. 6, (Jun. 1978), D. B. Novotny et al, "Automated Photomask Inspection," pp. 59–67.
Reticle Mask Automatic Defect Inspecting Device; D. Awamura (transliterated); Electronic Material; Jun. 1982.
"An Automatic Mask and Reticle Inspection System"; Hal Yang; Proceedings of the Society of Photo-Optical Instrumentation Engineers; Mar. 31, 1982.

Primary Examiner—Edward J. Wise
Attorney, Agent, or Firm—Oblon, Fisher, Spivak, McClelland & Maier

[57] ABSTRACT

A photomask on which a circuit pattern is drawn is placed on an x-y table and is illuminated by a light source. A linear image sensor, on which the circuit pattern is imaged, measures the circuit pattern along the direction substantially perpendicular to a moving direction of the x-y table to generate an analog signal in units of measured positions on the mask. In order to eliminate the need for matching the size of the pixel to be measured with the pixel size of the design pattern data and allow effective detection of a defect smaller than the pixel size, an analog-to-digital converter is arranged to convert the analog signal to multi-level digital data, and a measured point calculation circuit calculates the position of the measured point in units smaller than the pixel size unit in accordance with the position of the x-y table. A reference data calculation circuit is provided to calculate multi-level reference digital data which is to be obtained when the design pattern is measured at a calculated measured point taking sensitivity distribution characteristics (including resolution characteristics of lens) of image sensor elements into consideration. A defect detector compares the measured data with the reference data to detect the presence or absence of defects of the circuit pattern on the photomask.

11 Claims, 15 Drawing Figures

APPARATUS FOR INSPECTING A CIRCUIT PATTERN DRAWN ON A PHOTOMASK USED IN MANUFACTURING LARGE SCALE INTEGRATED CIRCUITS

BACKGROUND OF THE INVENTION

The present invention relates to an apparatus for inspecting a circuit pattern drawn on a photomask (reticle) used in manufacturing large scale integrated circuits (LSIs).

An apparatus is disclosed in an article entitled "A Reticle and Mask Automatic Defect Inspection Apparatus", the Journal "Denshi Zairyo" (Electronic Material), pp. 50 to 54, No. 6, 1982, issued in Japan, which compares measured pattern data obtained by optically measuring a circuit pattern of a photomask with design (original) pattern data used in drawing the circuit pattern on the photomask to detect photomask defects. The design pattern data is provided in the form of binary data for each pixel of the photomask.

In the conventional apparatus, the design data is converted to data of dots each having the same size as the measured pixel which depends upon the size of an image sensor element. A measured value from the image sensor element is given in the form of binary data and is compared with the design data in units of dots. In the apparatus, the measured point on the photomask measured by the image sensor element can only be expressed in units of dots. Intermediate measured values are rounded off to "1" or "0" for bi-level quantization. Therefore, the determination of a pattern defect is made only when a difference between the design data and the measured data exists with respect to 2 or 3 consecutive dots, allowing for measurement errors. Since the size of the measured pixel, depending on the size of an image sensor element, is the same as that of design pattern data, the pixel size of the design pattern data must be converted for each of photomasks which have different scaling factors. In order to improve the defect detection precision in the inspecting apparatus of this type, the size of the pixel to be measured must be decreased. In this case, in order to maintain the measuring speed even if the pixel size is decreased, the rate at which the photomask is scanned by the image sensor must be high, inversely proportional to the square of the pixel size, resulting in serious problems.

SUMMARY OF THE INVENTION

It is an object of the present invention to provide an improved photomask inspecting apparatus wherein the size of pixels of the photomask to be measured need not be equal to that of design pattern data and a defect smaller than the pixel of the photomask can be detected.

According to the present invention, a circuit pattern drawn on a photomask (reticle) placed on a measuring table is optically measured by an optical pattern measuring means in the direction perpendicular to a table moving direction to provide analog measured signals at measured points on the mask, and the analog measured signal is converted to multi-level digital data by an analog-to-digital converter. A measured point calculation circuit calculates the position of each measured point in units smaller than the pixel size in accordance with table position data from a table position measuring means. A reference data calculation circuit means is provided which calculates reference data which is to be obtained when the design circuit pattern is measured at each measured point on the basis of design pattern data of a two-dimensional pixel array having at its center a pixel which includes the measured point, position data of the measured point, and sensitivity distribution characteristic data (including resolution characteristics of a lens) of an image sensor element of the optical pattern measuring means. The reference data is given as multi-level digital data. The measured data is compared with the reference data to detect any defect in the circuit pattern.

DETAILED DESCRIPTION OF THE PREFERRED EMBODIMENT

Figure 1:
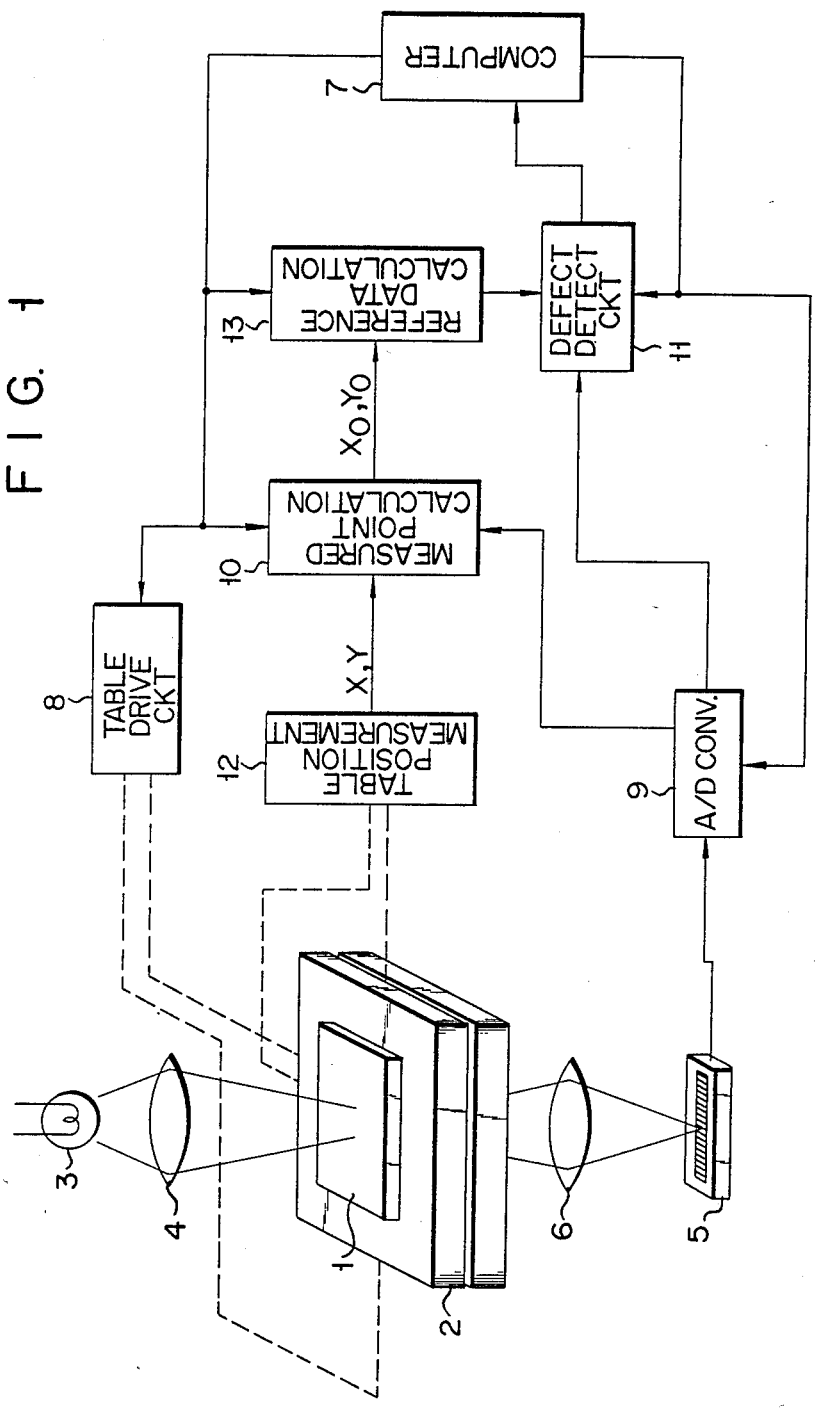
FIG. 1 shows circuit pattern inspecting apparatus embodying this invention.

Referring to FIG. 1, a photomask (reticle) 1 on which an LSI circuit pattern is drawn by an electron-beam patterning apparatus is placed on an x-y table 2. The photomask 1 is illuminated by a light source 3 through a condenser lens 4. The circuit pattern on the photomask 1 illuminated by the light source 3 is imaged by an objective 6 on a linear image sensor 5 which has a number of sensor elements such as photodiodes. The objective 6 is disposed under the x-y table 2. The linear image sensor 5 is disposed to measure the mask pattern along the x-axis. The linear image sensor 5 is arranged to measure the intensity of light transmitted at each of the measured points of the photomask along the x-axis, by electrically scanning e.g., 512 image sensor elements, to produce analog measured signals.

Figure 2:
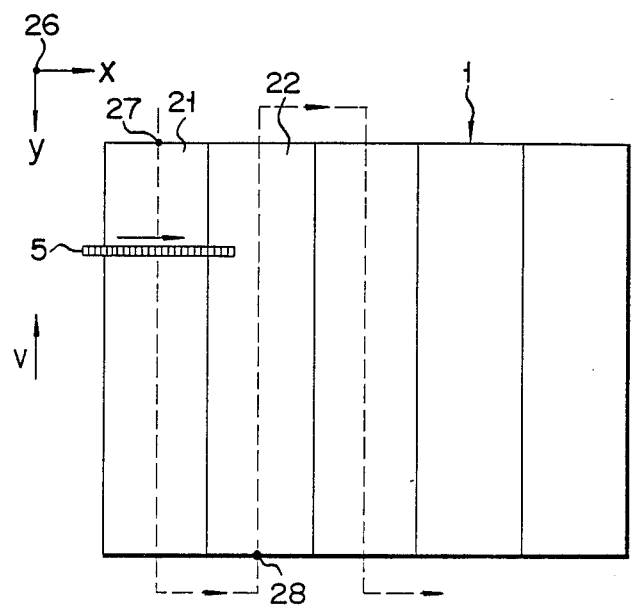
FIG. 2 is a diagram for explaining the measuring procedures of the photomask.

The mask-pattern measurement is carried out by the fixed linear image sensor 5 while the table 2 is continuously driven along the y-axis by a table drive circuit 8 which is controlled by a computer 7. As shown in FIG. 2, the photomask 1 is divided into a plurality of stripe areas (referred to as "frames" hereinafter) 21, 22, . . . extending along the y-axis for measurement purposes. The mask-pattern measurement is carried out for each frame. The linear image sensor 5 has a length equal to or slightly greater than the width of each frame along the x-axis. Dotted arrows indicate the direction of movement of table 2. For example, when the frame 21 is measured, the table 2 is continuously driven in the positive direction of the y-axis. After the frame 21 has been measured, the table 2 is moved by a distance corresponding to the width of the frame in the positive direction of the x-axis. Thereafter, the table 2 is moved in the negative direction of the y-axis to measure the frame 22. In this manner, the entire area of photomask 1 is measured. Reference numeral 26 in FIG. 2 denotes an origin or reference point with respect to which the table position is measured. Reference numerals 27 and 28 denote start positions of the frames 21 and 22, respectively. A typical size of the photomask 1 is 5 inches×5 inches.

An analog-to-digital (A/D) converter 9 electrically scans the image sensor 5 to derive an analog measured signal for each measured point in synchronism with the reference clock signal of the present apparatus, and converts the analog signal to multi-level digital data (e.g., 6 bits). The A/D converter 9 supplies a scanning start sync signal to a measured point calculation circuit 10 and a digital measured signal to a defect detect circuit 11.

The measured point calculation circuit 10 receives table position data from a table position measurement circuit (laser interferometric measuring system) 12 in synchronism with the scanning start sync signal and calculates the position of each measured point on the photomask 1 being measured by an image sensor element of the image sensor 5 in synchronism with the reference clock signal, using position calculating parameters, to be described later, supplied from the computer 7. The position of a measured point which is calculated by the measured point calculation circuit 10 corresponds to the position on the photomask 1 of the measured signal which is being obtained from the image sensor 5 and the A/D converter 9. The position data calculated by the measured point calculation circuit 10 is supplied to a reference data calculation circuit 13.

The reference data calculation circuit 13 receives from the computer 7 design pattern data representing the design pattern on the photomask 1 in the form of binary data for each pixel, and calculates a measured value (reference data) which is to be obtained from image sensor 5 when the design pattern is measured at each of the measured points, taking sensitivity distribution characteristics (including resolution characteristics of lens) into account, thereby providing 6-bit multilevel reference data.

The defect detect circuit 11 compares the measured data from the A/D converter 9 with the reference data from the reference data calculation circuit 13. When a difference between the measured data and the reference data is greater than a specified threshold value, a defect in the mask pattern is detected.

The measured point calculation circuit 10 will now be described with reference to FIG. 3.

The measured point calculation circuit 10 receives from the computer 7 position calculation parameters such as start position data (x- and y-axes) of a frame of the mask 1, sensor pitch data (x-axis) of the image sensor 5, a $\theta$ correction value (y-axis), and a reticle inclination correction value. The frame start position data indicates the start position 27 or 28 of each frame as shown in FIG. 2 and is supplied from computer 7 at the start time of each frame measurement. The sensor pitch data indicates the x-axis pitch of the sensor elements of the image sensor 5. Due to the pitch data the point to be measured by image sensor 5 is shifted by pitches in the x-axis direction. When the size of the sensor element is 1.4 $\mu m \times 1.4$ $\mu m$, the pitch data may be given by 1.4 $\mu m$.

Figure 4:
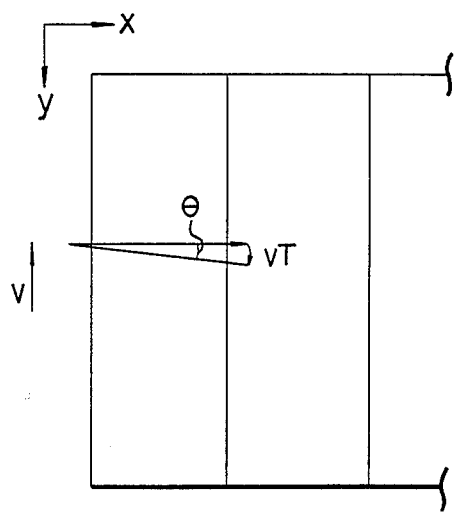
FIG. 4 is a diagram for explaining the displacement of measuring position on the photomask upon movement of a table during testing.

The $\theta$ correction value is used to correct y-axis position error during pattern measurement. Since the table 2 is continuously moved in the y-axis direction during pattern measurement, a displacement vT along the y-axis occurs between the scanning start position and the scanning end position as shown in FIG. 4, where v is a constant speed of the table 2, and T is the scanning time. Therefore, errors occur in the y-position data of the measured points on the photomask 1. In order to eliminate the positional errors along the y-axis, a predetermined $\theta$ correction value is added to the y-position data of each measured point. It is inevitable that the reticle 1 is placed on the table 2 with a slight inclination with respect to the y-axis due to the mechanical precision of a mechanism for holding the reticle 1 on the table 2. Therefore, an error occurs in the x-axis position of each measured point. In order to eliminate the x-axis position error, an angle correction value is added to the corresponding x-position data (initial value) at each scanning start position along the x-axis, which varies with the y-position of the scanning start position.

According to the present apparatus, the calculation of measured positions is carried out taking the pixel size of design data as a reference unit. For example, when the pixel size of design pattern data is 0.9×0.9 $\mu m$, the measuring unit of the table position measuring circuit and the position calculating parameters set to the measured point calculation circuit are correspondingly adjusted so that the output of the measured point calculation circuit represents the number of pixels from the frame start position to the measured point. The shape of sensitivity distribution characteristics of an image sensor element is also modified in accordance with the pixel size. With the present apparatus, therefore, design data whose pixel size is modified or scaled can be handled without conversion of the pixel size according to the size of an image sensor element.

Figure 3:
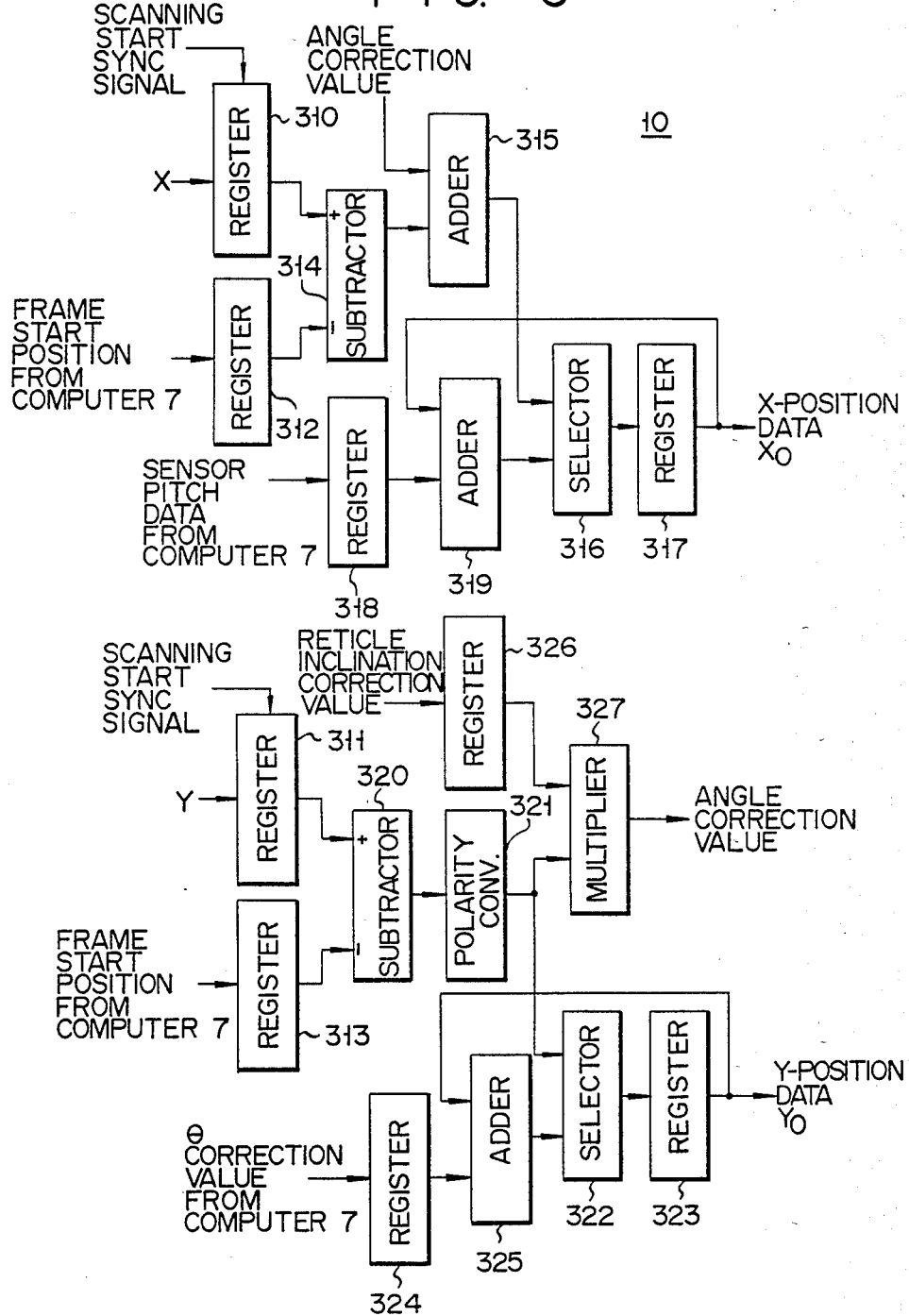
FIG. 3 is a block diagram of a measured point calculation circuit shown in FIG. 1.

Referring to FIG. 3, the current position data X, Y of the table 2 with respect to the origin 26 (FIG. 2) are supplied from the table position measurement circuit 12 to registers 310 and 311, respectively. These position data are latched in the registers 310 and 311 in synchronism with the scanning start sync signal. The latched data indicates the measuring position of the first sensor element of the image sensor 5. The start position data of a frame to be measured is supplied from computer 7 to registers 312 and 313. The difference between data latched in the registers 310 and 312 is calculated by a subtractor 314. This difference indicates the distance from the frame start position to the measuring point of the first sensor element along the x-axis. The reticle angle correction value proportional to the y-position data is added by an adder 315 to an output of the subtractor 314. An output of the adder 315 is supplied to an x-position register 317 through a selector 316. The register 317 latches input data in synchronism with the reference clock signal. The output of the adder 315 is latched in the position register 317 as the x-position data (initial value) of the measuring point of the first sensor element. The sensor pitch data is supplied from the computer 7 to a register 318, and then added by an adder 319 to the output data of the position register 317. The output data of adder 319 is supplied to the position register 317 through the selector 316. After the initial value has been latched by the position register 317, the selector 316 selects the output of the adder 319. The x-position data of the measuring points of the sensor elements are sequentially latched in the position register 317 during each frame-scanning operation of image sensor 5.

A difference between data latched in the registers 311 and 313 is calculated by a subtractor 320. This difference indicates a distance between the measuring point of the first sensor element at the scanning start time and the frame start position along the y-axis and has a different sign (positive or negative) in accordance with the direction of table movement along the y-axis. As shown in FIG. 2, the difference is positive when the frame 21 is being measured. However, the difference is negative when the frame 22 is being measured. A polarity converter 321 is provided to convert a negative difference value to a positive difference value. An output of the polarity converter 321 is latched, as the y-position data (initial value) of the measuring point of the first sensor element, in a y-position register 323 through a selector 322 in synchronism with the reference clock signal. After the y-position initial value has been latched in the y-position register 323, the selector 322 applies an output of an adder 325 to the position register 323. The $\theta$ correction value is supplied from the computer 7 to a register 324. The adder 325 adds the correction value to the output of the y-position register 323. Therefore, the position register 323 sequentially provides y-position data of the measured points on the mask along the x-axis. The reticle inclination correction value is supplied from the computer 7 to a register 326, and this correction value is multiplied, in a multiplier 327, by the y-position initial value from the subtractor 320 at the scanning start time. The multiplier 327 thus provides an angle correction value which varies with the y-position. This angle correction value is added by the adder 315 to the x-position initial value from the subtractor 314, thereby accomplishing reticle inclination correction.

The table position measurement circuit 12 is arranged to measure the table position to a precision of 1/10 the pixel size (e.g., 1 μm×1 μm) of the photomask. The position data ($X_0$, $Y_0$) provided by the x- and y-position registers 317 and 323 indicates the measured position more accurately than the pixel size. In the calculation of position data $X_0$, $Y_0$ the pixel size of the design data is taken as a reference unit. The calculated position data $X_0$, $Y_0$ indicate the number of pixels from the frame start position. In other words, the position data ($X_0$, $Y_0$) specify not only a pixel on the photomask 1 but also the measured point ($x_0$, $y_0$) within this pixel.

The reference data calculation will now be described. The reference data calculation circuit 13 calculates a value (reference data) which is to be obtained as the measured data when a design pattern having no defect is measured at the measured position calculated by the measured point calculating circuit 10. In this case, the reference data is calculated taking the sensitivity distribution characteristics of the sensor elements as shown in FIG. 5 into consideration.

Figure 5:
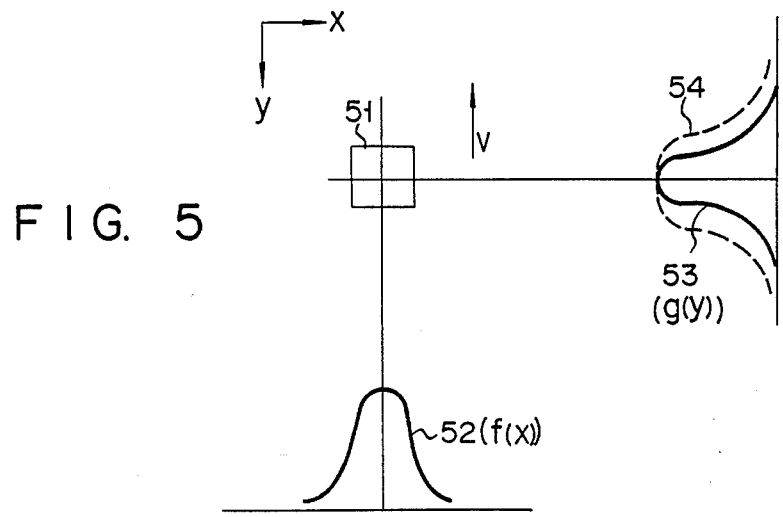
FIG. 5 is a diagram for explaining a sensor element and its sensitivity distribution characteristics.

Referring to FIG. 5, reference numeral 51 denotes the physical shape of a sensor element. The sensor element has a size of 1.4 μm×1.4 μm, for instance. In general, the sensor element has such sensitivity distribution characteristics as indicated by curves 52 and 53 due to light-scattering and lens resolution characteristics. The curve 52 indicates a sensitivity distribution characteristic f(x) along the x-axis, and the curve 53 indicates a sensitivity distribution characteristic g(y) along the y-axis. The sensor element used in this embodiment produces a value obtained by integrating the input illuminance with respect to scanning time. Therefore, based on the fact that the table 2 is continuously moved along the y-axis, the y-axis sensitivity distribution is expanded along the y-axis as indicated by a dotted line 54 and given as follows:

$$g'(y) = 1/vT \int_{-1/2vT}^{+1/2vT} g(y + s)ds \quad (1)$$

where g(y) is the function represented by curve 53, v is the table speed, and T is the scanning time. Therefore, vT indicates the distance by which the table moves during the scanning period. It should be noted that each sensor element has a sensitivity distribution extending over an area larger than the size of the sensor element.

Figure 6:
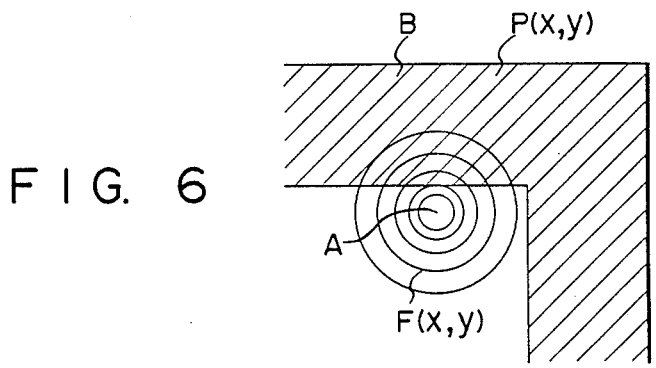
FIGS. 6 and 7 are diagrams for explaining the operations of a reference data calculation circuit of FIG. 1.

FIG. 6 is a diagram for explaining the calculation processing effected by the reference data calculation circuit 13. Point A is a measured point on the mask which is calculated by the measured point calculation circuit 10. The sensitivity distribution characteristics of the sensor element are illustrated in the form of concentric circles (i.e., contour lines). In this embodiment, the sensitivity distribution characteristics of the sensor element are given by F(x, y)=f(x)·g'(y). Reference symbol B in FIG. 6 denotes a design pattern. The design pattern B is represented by P(x, y) on the same coordinates as the sensitivity characteristics of the sensor element. The design pattern P(x, y) is a binary function which indicates a light-transmissive portion by "1" and a light-non-transmissive portion by "0".

A value R to be obtained from a sensor element measuring the point A can be calculated as follows:

$$R = k \int_{-\infty}^{+\infty} \int_{-\infty}^{+\infty} P(x, y) \cdot F(x, y) dx dy \quad (2)$$

where k is a correction coefficient for matching the calculated value with the measured value.

Figure 7:
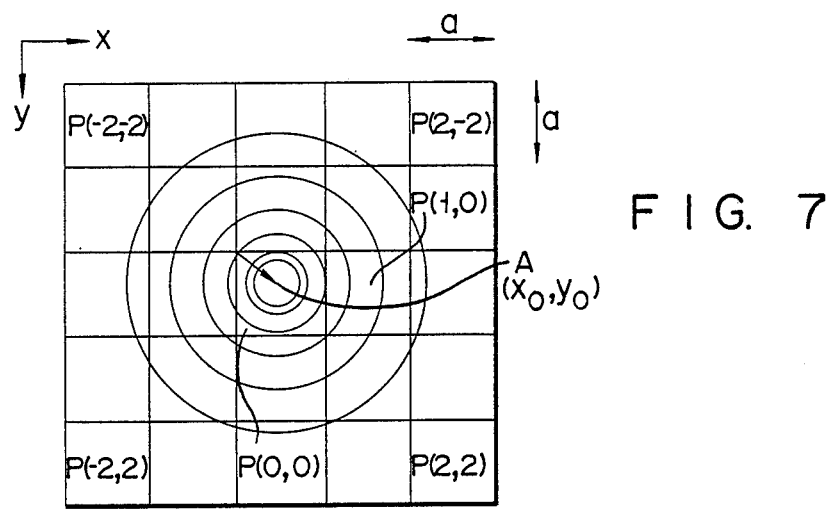

Equation (2) indicates the processing that is to be performed by the reference data calculation circuit 13. However, the calculation of reference data using equation (2) requires a complicated circuit arrangement of the calculation circuit (13). With this embodiment, in order to simplify the circuit arrangement, the integration range is limited to an effective range. For ease of description, the integration range is assumed to be within a 5×5 pixel (dot) array as shown in FIG. 7. Each side of a pixel is 1 μm, and the values of x and y at a measured point are given in units of 0.1 μm. The pixel, including the measured point, is represented as P(0, 0), and the measured point with respect to the upper left corner of the pixel P(0, 0) is given as ($x_0$, $y_0$). When only the pixel P(0, 0) positioned at the center of the 5×5 pixel array indicates "1", an output of the sensor element measuring the measured point ($x_0$, $y_0$) is calculated as follows:

$$R_{0,0} = k \int_{y=-y_0}^{1-y_0} \int_{x=-x_0}^{1-x_0} P(0, 0) \cdot F(x, y) dx dy \quad (3)$$

Equation (3) can be approximated as follows:

$$R_{0,0} = k' \sum_{k=0}^{9} \sum_{k=0}^{9} P(0, 0) \cdot F(-x_0 + k/10, -y_0 + l/10) \quad (4)$$

Equation (4) indicates that the pixel (dot) P(0, 0) is divided into 10×10 subpixels, and that the sensitivity distribution characteristic F(x, y) of the sensor element centered at the measured point $(x_0, y_0)$ is assigned to each of the subpixels.

In general, when only a pixel $P(i, j)$ among the $5\times 5$ dot array centered at $P(0, 0)$ indicates "1", an output of the sensor element corresponding to the measured point $(x_0, y_0)$ within the pixel $P(0, 0)$ is given as follows:

$$R_{i,j} = k' \sum_{k=0}^{9} \sum_{l=0}^{9} P(i, j) \cdot F(i - x_0 + k/10, j - y_0 + l/10) \quad (5)$$

Taking the design pattern of $5\times 5$ pixels centered at $P(0, 0)$ into consideration, an output of the sensor element for measuring the measured point $(x_0, y_0)$ may be calculated by the reference data calculation circuit 13 as follows:

$$R = \sum_{i=-2}^{+2} \sum_{j=-2}^{+2} k' P(i, j) \sum_{k=0}^{9} \sum_{l=0}^{9} F(i - x_0 + k/10, j - y_0 + l/10) \quad (6)$$

$$= \sum_{i=-2}^{+2} \sum_{j=-2}^{+2} R_{ij}$$

where $R_{ij}$ is a function of $x_0$, $y_0$, $i$, $j$, and $P(i, j)$; $i$ and $j$ indicate the position of a pixel within the $5\times 5$ dot array; $x_0$ and $y_0$ indicate the position of the measured point within the pixel; and $P(i, j)$ is a binary pattern ("1" or "0") of the pixel.

Assuming that ¶ (i) indicates patterns of five pixels in a column of the $5\times 5$ pixel array, i.e. $[P(i, -2), P(i, -1), P(i, 0), P(i, 1), P(i,2)]$, $$\sum_{j=-2}^{+2} R_{ij}$$

is a function of $x_0$, $y_0$, $i$, and ¶ (i). Equation (6) may be rewritten as follows:

$$R = \sum_{i=-2}^{+2} R(x_0, y_0, i, ¶(i)) \quad (7)$$

As is apparent from the above description, the reference data calculation may be performed in the following manner. The measured point calculation circuit 10 specifies one pixel (corresponding to $P(0, 0)$) on the photomask and a measured point $(x_0, y_0)$ within the pixel. When the pixel $P(0, 0)$ is specified, the design pattern data $P(i, j)$ ($i=-2\sim +2$, $j=-2\sim +2$) of the $5\times 5$ pixels can be extracted from the entire design pattern data. Therefore, the reference data R for the measured point $(X_0, Y_0)$ within the pixel $P(0, 0)$ can be found by calculating $R(x_0, y_0, i, ¶(i))$ using five-pixel data ¶ (i) for each of columns of $5\times 5$ pixel array and adding together R calculated for each column.

Figure 8:
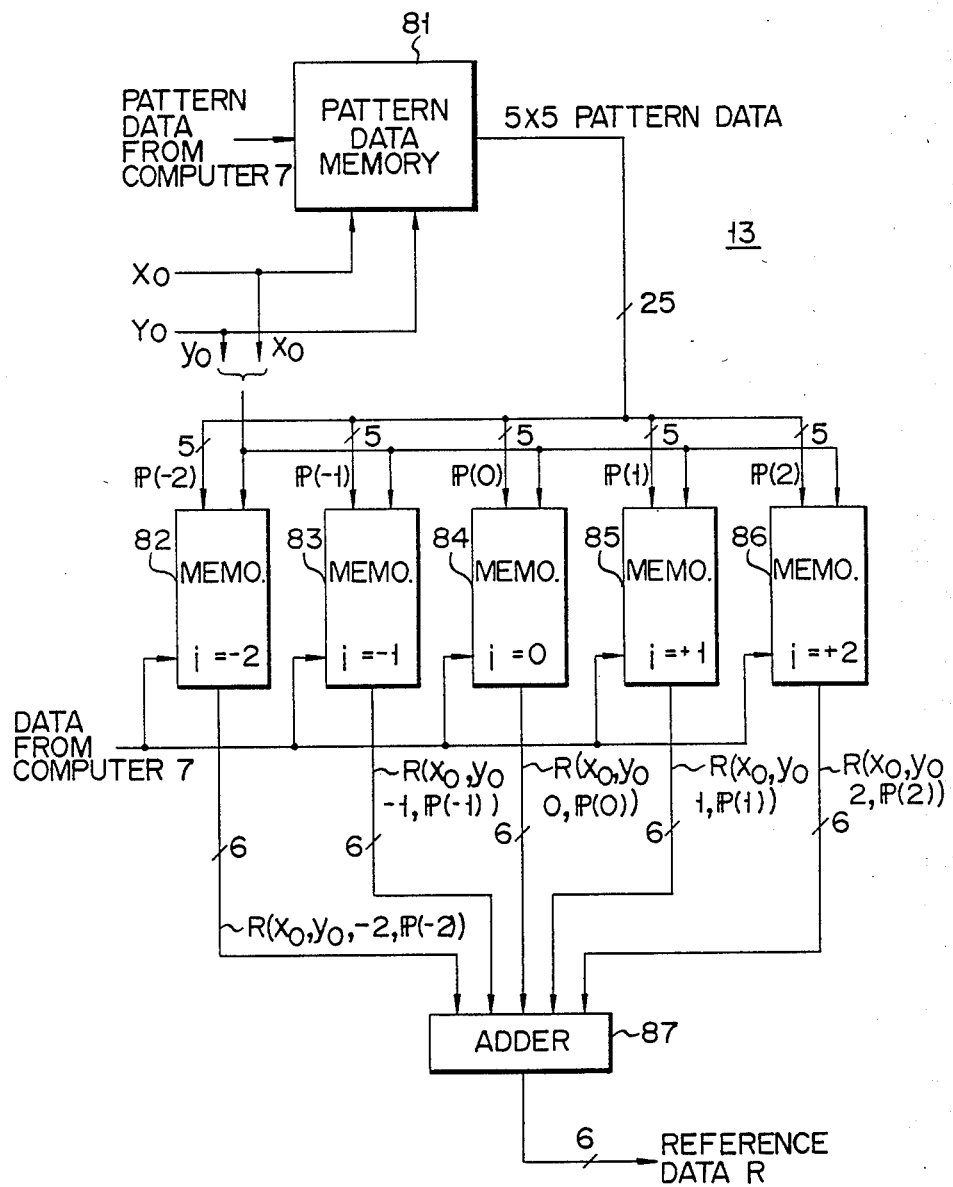
FIG. 8 shows a practical arrangement of the reference data calculation circuit according to the present invention.

A practical arrangement of the reference data calculation circuit 13 will now be described with reference to FIG. 8.

The binary design pattern data is supplied from the computer 7 to a pattern data memory 81 in units of 1 μm-unit (pixel size unit) in the calculated position data $(X_0, Y_0)$ is supplied as an address signal to the data memory 81. When one pixel position is designated by the 1 μm-unit position data, the design pattern data of the $5\times 5$ pixel array centered at the designated pixel $(P(0, 0))$ is read out from the data memory 81. Pattern data ¶ (−2), ¶ (−1), ¶ (0), ¶ (1) and ¶ (2) in the five columns are supplied as address signals to submemories 82 to 86, respectively. The position data $X_0$ and $Y_0$ of the measured point calculated by the measured point calculation circuit 10 in units of 0.1 μm (1/10 unit of pixel size) are supplied as address signals to the submemories 82 to 86. $R(x_0, Y_0, i, ¶(i))$ has been calculated in advance by the computer 7 for the entire circuit pattern. Thus, $R(x_0, Y_0, -2, (-2))$, $R(x_0, Y_0,-1, ¶(-1))$, $R(x_0, Y_0, 0, ¶(0))$, $R(x_0, Y_0, ¶(1))$ and $R(x_0, Y_0, 2, (2))$ are stored in the submemories 82 to 86, respectively. With this arrangement, when the submemories 82 to 86 are accessed by the address signals $(x_0, Y_0, ¶(i))$, data $R(x_0, Y_0, i, ¶(i))$ ($i=-2$ to 2) are read out from the submemories 82 to 86, respectively. The output data from the submemories are added together in an adder 87 to provide the reference data R given by equation (7). The reference data R is provided as a 6-bit multi-level digital signal.

In the above description, the pixel size of the photomask is assumed to be 1 μm × 1 μm. When the pixel size of the photomask is 0.9 μm × 0.9 μm, the table position measuring circuit 12 measures the position of the measuring table 2 in units of 0.09 μm. The sensor pitch data and θ correction value set to the measured point calculation circuit 10 may be 1.4/0.9 μm and θ/0.9, respectively. The sensitivity distribution characteristic data of image sensor element used in the reference data calculation circuit 13 may be divided in units of 0.9/10 μm.

Figure 9:
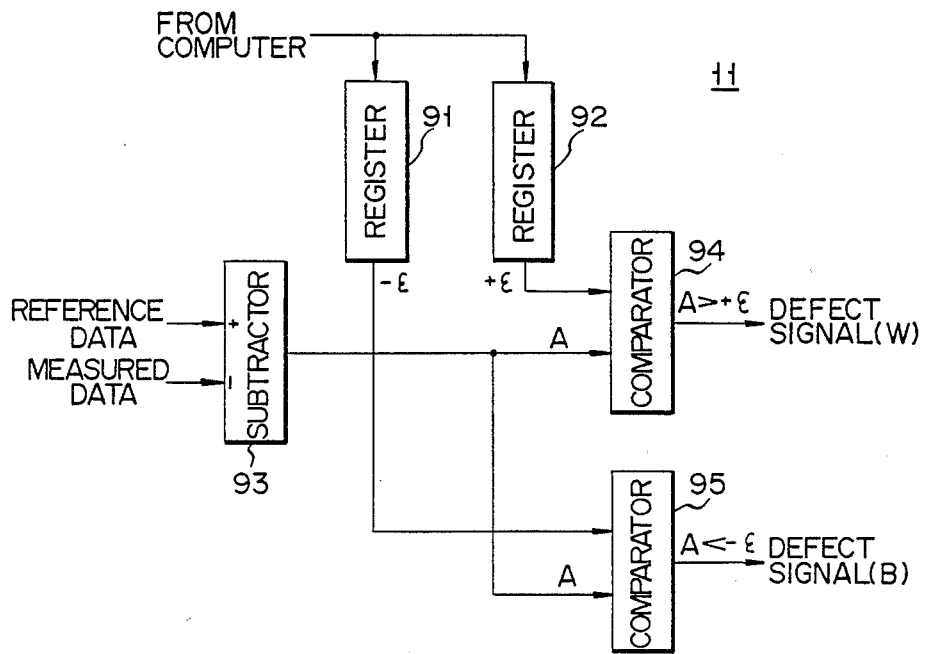
FIG. 9 is a block diagram of a defect detect circuit shown in FIG. 1.

The defect detect circuit 11 will now be described with reference to FIG. 9. Defect detection threshold values −ε and +ε are supplied from the computer 7 to registers 91 and 92, respectively. The difference A between the reference data and the measured data is obtained by a subtractor 93. The difference A is compared by a comparator 94 with the defect detection threshold value +ε. When A > +ε, a defect signal of logic level "1" is produced from the comparator 94 to indicate the presence of a light-transmitting (white) defect on the pattern. The difference A is also compared by a comparator 95 with the defect detection threshold value −ε. When A < −ε, a defect signal of logic level "1" is produced from the comparator 95 to indicate the presence of a black (opaque) defect on the pattern. These defect signals are supplied to the computer 7. The defect detection values +ε and −ε are preset to prevent any erroneous detection caused by a noise component of the measured signal and a positioning error.

Figure 10:
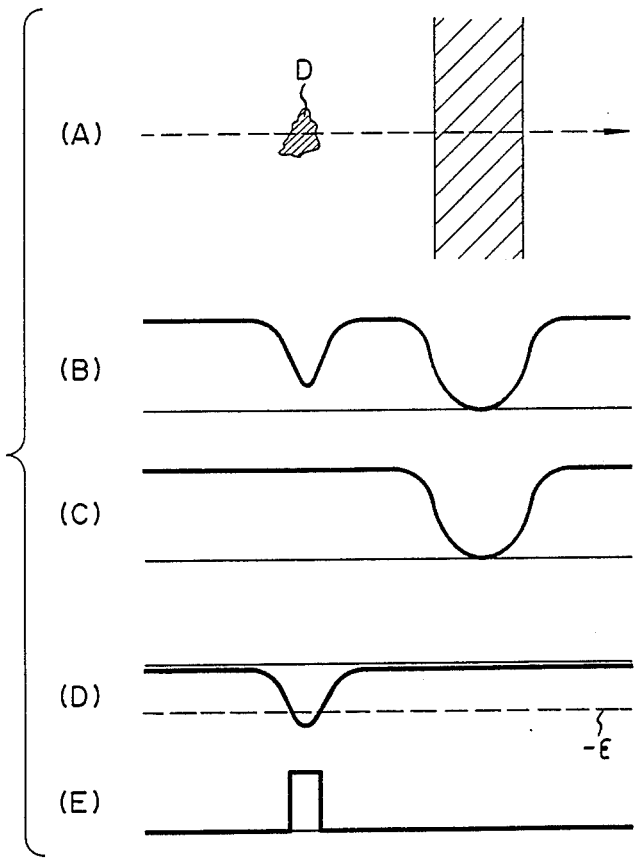
FIGS. 10(A) to 10(E) are diagrams for explaining the operation of the defect detect circuit.

The operation of the defect detection circuit 11 will be briefly described with reference to FIGS. 10(A) to 10(E). When an opaque defect portion D in the light-transmitting portion is scanned as shown in FIG. 10(A), measured digital data as shown in FIG. 10(B) is taken from the A/D converter 9. The reference data calculation circuit 13 provides the reference data (FIG. 10(C)) corresponding to the design pattern. In this case, an output signal shown in FIG. 10(D) is produced from the subtractor 83 of the defect circuit 11. When the level of this output signal is less than the defect detection threshold value −ε, the comparator 95 produces the defect signal, as shown in FIG. 10(E), to indicate the presence of the black (opaque) defect in the light-transmitting portion.

Figure 11:
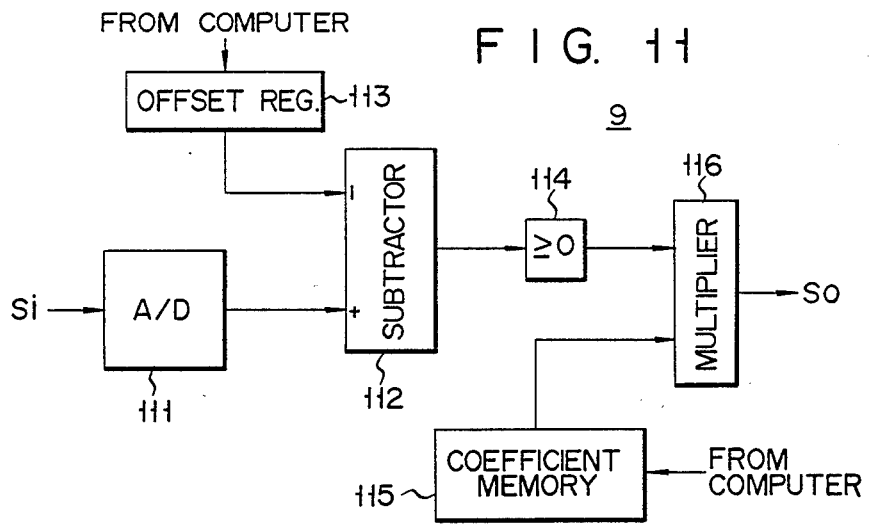
FIG. 11 is a practical arrangement of an A/D converter shown in FIG. 1.

In the inspecting apparatus of the present invention, changes in illuminance on the photomask with the scanning positions along the x-axis and variations in sensitivity of the sensor elements of the linear image sensor degrade the defect detection capability. For this reason, the A/D converter 9 is arranged as shown in FIG. 11.

An A/D converter 111 converts a measured signal Si to digital data in synchronism with a reference clock signal. From this digital data is subtracted in a subtractor 112 an offset value supplied from the computer 7 and stored in an offset register 113. The negative data from the subtractor 112 which may be caused by noise is rounded off to zero by a zero clip circuit 114. Multiplication coefficients depending on the variation in sensor element sensitivity and the irregularity of quantity of light along the x-axis is supplied from the computer 7 to a coefficient memory 115 and is stored therein. The output data of the subtractor 112 is multiplied in a multiplier 116 by the corresponding coefficient from the coefficient memory 114, thereby obtaining a compensated measured data $S_0$.

In the embodiment described above, the linear image sensor is used. However, the mask pattern may be scanned with a laser beam spot, and transmitted light may be measured. In this case, the shape of the laser spot and the distribution of the amount of light within the spot may be taken into consideration in calculating the reference data.

What is claimed is:

1. An apparatus for inspecting a circuit pattern of a photomask for manufacturing large scale integrated circuits comprising:
   a measuring table on which the photomask is placed, said measuring table being movable along x and y directions;
   table driving means for continuously moving said measuring table in one direction;
   table position measuring means for measuring a position of said measuring table;
   optical pattern measuring means for scanning the photomask in a direction substantially perpendicular to the moving direction of said measuring table to sequentially produce analog measured signals at measured points along the scanning direction of the photomask in response to light transmitted through the photomask;
   analog-to-digital converting means coupled to said optical pattern measuring means for converting the analog signal to multi-level digital measured data;
   measured point calculation circuit means for calculating, in response to said table position measuring means, the position of a measured point within a pixel of the photomask being measured by said optical pattern measuring means to provide position data of the measured point;
   reference data calculation circuit means for calculating reference data, as multi-level digital data, which is to be obtained as measured data when a design circuit pattern is measured by said optical pattern measuring means at each of the measured points on the basis of the design pattern data represented by binary data for each of a plurality of pixels within a two-dimensional pixel array centered at the pixel including the measured point on the photomask being measured by said optical pattern measuring means, the position data of the measured point on the photomask calculated by said measured point calculation circuit means, and sensitivity distribution characteristic data of an image sensor element of said optical pattern measuring means; and
   defect detecting means for comparing the measured data from said analog-to-digital converting means with the reference data calculated by said reference data calculation circuit means to detect the presence or absence of a pattern defect at the measured point.

2. An apparatus according to claim 1, wherein said optical pattern measuring means comprises a light source for illuminating the photomask on said measuring table, and a linear image sensor having a plurality of image sensor elements to scan the photomask in a direction perpendicular to the moving direction of said measuring table.

3. An apparatus according to claim 1, wherein a function used as the sensitivity distribution characteristic data of said image sensor element used in said reference data calculation circuit means is expanded in the moving direction of said measuring table according to the moving speed thereof.

4. An apparatus according to claim 1, wherein said measured point calculation circuit means is arranged to calculate the position of each measured point on the photomask measured by said optical pattern measuring means by adding a predetermined value to the position data of the immediately previous measured point in the direction perpendicular to the moving direction of said measuring table.

5. An apparatus according to claim 4, wherein said optical pattern measuring means comprises a linear image sensor having a plurality of sensor elements for scanning the photomask in the direction perpendicular to the moving direction of said measuring table, and the predetermined value added to the position data of the immediately previous measured point in said measured point calculation circuit means corresponds to the pitch of said sensor elements of said linear image sensor.

6. An apparatus according to claim 1, wherein said measured point calculation circuit means is arranged to correct the position of each measured point in the moving direction of said measuring table in units of predetermined values in accordance with a measured point in the direction perpendicular to the moving direction of said measuring table and the moving speed of said measuring table.

7. An apparatus according to claim 1, wherein the photomask is divided into a plurality of stripe areas parallel to each other in the moving direction of said measuring table, and said optical pattern measuring means is arranged to measure the circuit pattern for each of stripe areas.

8. An apparatus according to claim 7, wherein said measuring table is moved in different directions during the measurements of a frame and an adjacent frame of the photomask.

9. An apparatus according to claim 1, wherein said defect detecting means is arranged to detect a light transmissive defect and a light non-transmissive defect of the circuit pattern of the photomask.

10. An apparatus according to claim 1, wherein said analog-to-digital converting means is arranged to multiply the digital data at each of measured points by a correction coefficient corresponding to the position of the measured point along the scanning direction of the photomask.

11. An apparatus according to claim 1, wherein said reference data calculation circuit means comprises a pattern data memory storing the design pattern data and responsive to the position data calculated by said measured point calculation circuit means to read out design pattern data of the two-dimensional array having a plurality of pixels centered at a pixel containing the measuring point; and submemory means for storing the reference data calculated in advance on the basis of design pattern data of the two-dimensional array centered at each pixel, the position data of measured points in each of centered pixels, and the sensitivity distribution characteristic data of said image sensor element, said submemory means being accessed by the position data of the measured point calculated by said measured point calculation circuit means and the design pattern data of the two-dimensional pixel array read out of said pattern data memory to read out the reference data for the measured point.

* * * * *